US010238017B2

United States Patent
Kurz et al.

(10) Patent No.: US 10,238,017 B2
(45) Date of Patent: Mar. 19, 2019

(54) MULTI-PIECE SHIELD

(71) Applicant: A.K. Stamping Company, Inc., Mountainside, NJ (US)

(72) Inventors: Arthur Kurz, New Vernon, NJ (US); Mark Andrews, Wharton, NJ (US); Michael Schneider, Montgomery, NY (US)

(73) Assignee: A.K. Stamping Company, Inc., Mountainside, NJ (US)

( * ) Notice: Subject to any disclaimer, the term of this patent is extended or adjusted under 35 U.S.C. 154(b) by 0 days.

(21) Appl. No.: 15/903,421

(22) Filed: Feb. 23, 2018

(65) Prior Publication Data

US 2018/0184551 A1 Jun. 28, 2018

Related U.S. Application Data

(63) Continuation of application No. 15/378,638, filed on Dec. 14, 2016, now Pat. No. 9,913,413.

(60) Provisional application No. 62/266,922, filed on Dec. 14, 2015.

(51) Int. Cl.
*H05K 9/00* (2006.01)
*H05K 7/20* (2006.01)

(52) U.S. Cl.
CPC ......... *H05K 9/0049* (2013.01); *H05K 7/2039* (2013.01); *H05K 9/0032* (2013.01); *H05K 9/0073* (2013.01)

(58) Field of Classification Search
CPC .............................. H05K 9/00; H05K 9/0032
See application file for complete search history.

(56) References Cited

U.S. PATENT DOCUMENTS

| 5,614,694 | A | 3/1997 | Gorenz, Jr. et al. |
| 6,269,008 | B1 | 7/2001 | Hsu |
| 6,304,458 | B1 | 10/2001 | Mendolia |
| 7,119,286 | B1 | 10/2006 | Horng |
| 7,724,542 | B2 | 5/2010 | Gallahan et al. |
| 7,961,479 | B2 | 6/2011 | Wang |
| 7,983,058 | B2 | 7/2011 | Ishihara |
| 8,383,960 | B2 | 2/2013 | Kurz et al. |
| 9,105,899 | B2 | 8/2015 | Pakula et al. |
| 9,635,789 | B2 | 4/2017 | English et al. |
| 2002/0185294 | A1 | 12/2002 | Shlyakhtichman et al. |
| 2007/0210082 | A1 | 9/2007 | English et al. |

(Continued)

OTHER PUBLICATIONS

International Search Report of the International Searching Authority dated Feb. 24, 2017, issued in connection with International Application No. PCT/US2016/66570 (3 pages).

(Continued)

*Primary Examiner* — Hung V Ngo
(74) *Attorney, Agent, or Firm* — McCarter & English, LLP

(57) ABSTRACT

This disclosure relates to a multi-piece shield comprising a fence, a lid, and an insert. The lid attaches to the fence, which is attached to the circuit board. The lid is a relatively thick, flexible material for supporting the insert. The lid has a recess so that the insert can be recessed into the lid to position the insert closer to the circuit for enhanced heat absorption. The insert is made of a thicker heat absorbing material than the lid, again to facilitate heat absorption. The insert can be press-fit into the recess of the lid. The lid can have a dovetail configuration to retain the insert in the lid.

14 Claims, 8 Drawing Sheets

(56) References Cited

U.S. PATENT DOCUMENTS

| | | |
|---|---|---|
| 2010/0157544 A1 | 6/2010 | Tsao et al. |
| 2011/0214916 A1* | 9/2011 | Chang ..................... H05K 9/00 174/382 |
| 2011/0266045 A1 | 11/2011 | Xiong et al. |
| 2012/0298414 A1 | 11/2012 | Park |
| 2013/0235528 A1 | 9/2013 | Lee et al. |
| 2013/0250540 A1 | 9/2013 | Hou |
| 2014/0071635 A1 | 3/2014 | Werner et al. |
| 2015/0201533 A1 | 7/2015 | Daughtry, Jr. et al. |
| 2017/0172019 A1 | 6/2017 | Kurz et al. |

OTHER PUBLICATIONS

Written Opinion of the International Searching Authority dated Feb. 24, 2017, issued in connection with International Application No. PCT/US2016/66570 (7 pages).

Notice of Allowance dated Apr. 11, 2017, issued in connection with U.S. Appl. No. 15/378,638 (9 pages).

Office Action dated Jun. 26, 2017, issued in connection with U.S. Appl. No. 15/378,638 (7 pages).

Notice of Allowance dated Nov. 9, 2017, issued in connection with U.S. Appl. No. 15/378,638 (8 pages).

* cited by examiner

MULTI-PIECE SHIELD

CROSS-REFERENCE TO RELATED APPLICATION

This application is a Continuation Application of U.S. Ser. No. 15/378,638 filed Dec. 14, 2016, which claims priority to U.S. Provisional Patent Application No. 62/266,922 filed on Dec. 14, 2015, the entire disclosure of the application hereby expressly incorporated by reference.

BACKGROUND OF THE DISCLOSURE

Field of the Disclosure

The disclosure relates generally to shielding elements, and more particularly to a multi-piece shield for circuitry on a circuit board.

Related Art

Shielding elements are used in electrical circuits to protect specific components of the circuit from electromagnetic radiation (e.g., spurious emission or irradiation). In particular, screening or shielding elements are used to comply with EMC (electromagnetic compatibility) standards.

One piece shields are typically used for thin devices where replaceable lids are not practical due to height restrictions and/or to minimize costs (e.g., compared to two piece shields). Two piece shields are generally more popular for circuit reworkability and testing, but are typically higher cost.

SUMMARY OF THE INVENTION

A multi-piece shield for enhanced shielding is provided herein. The multi-piece shield can provide for additional thermal benefits such as increased thermal conductivity. The multi-piece shield could be a three piece shield including a fence, a lid, and an insert. The fence is configured to surround the circuit when mounted to the circuit board, and the lid attaches to the top of the fence. The lid could include a recess for receiving an insert therein. The insert could be made of a different material and/or be of a greater thickness than the lid to facilitate shielding and heat absorption. The insert could also be made of a material having a higher thermal conductivity to further facilitate heat absorption. With such an assembly, the insert can be positioned over (and proximate to) the circuit to shield the circuit (e.g., from electromagnetic radiation) and dissipate heat from the circuit.

BRIEF DESCRIPTION OF THE DRAWINGS

The foregoing features will be apparent from the following Detailed Description, taken in connection with the accompanying drawing(s), in which.

DETAILED DESCRIPTION OF THE INVENTION

Disclosed herein is a multi-piece shield. The multi-piece shield provides improved shielding at a reduced weight by using a lid and insert of differing materials and/or thicknesses. The insert could be made of a material having a higher thermal conductivity and/or be of a greater thickness than the lid to facilitate shielding and heat absorption. As a result, the multi-piece shield provides efficient and cost effective shielding for use, reworkability, and/or testing of circuits.

Figure 1:
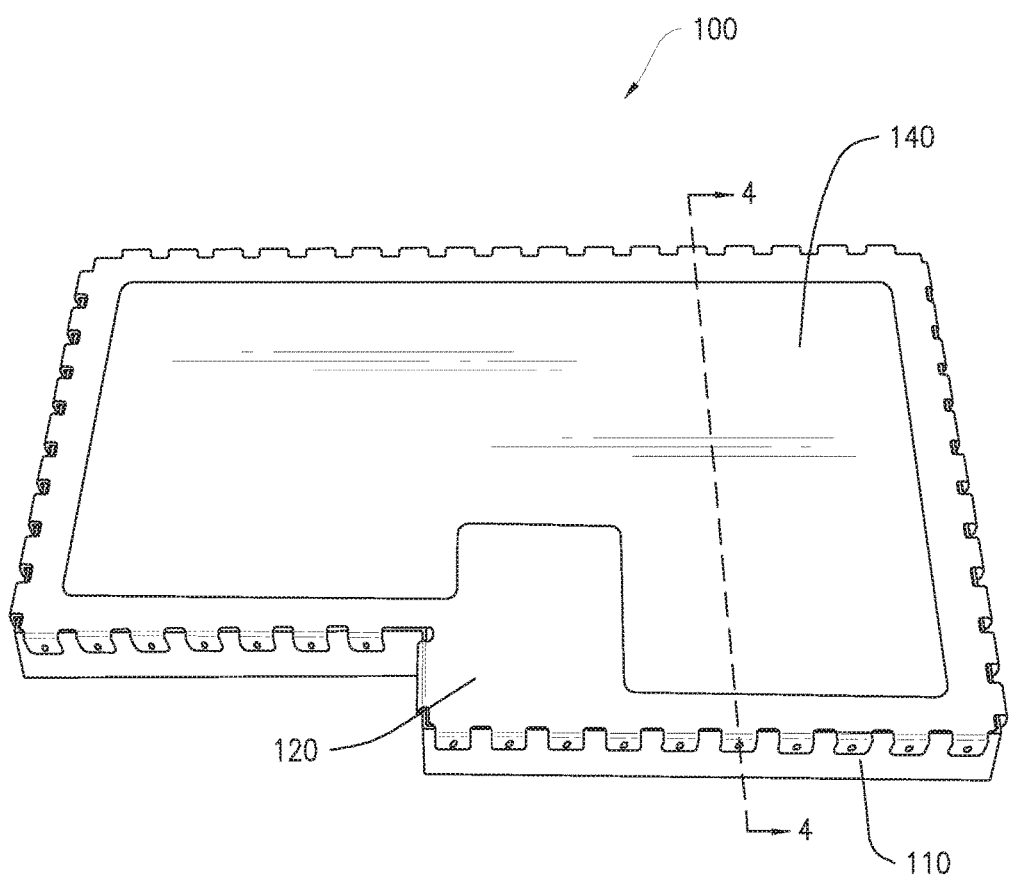
FIG. 1 is a perspective view of an assembled multi-piece shield.
Figure 2:
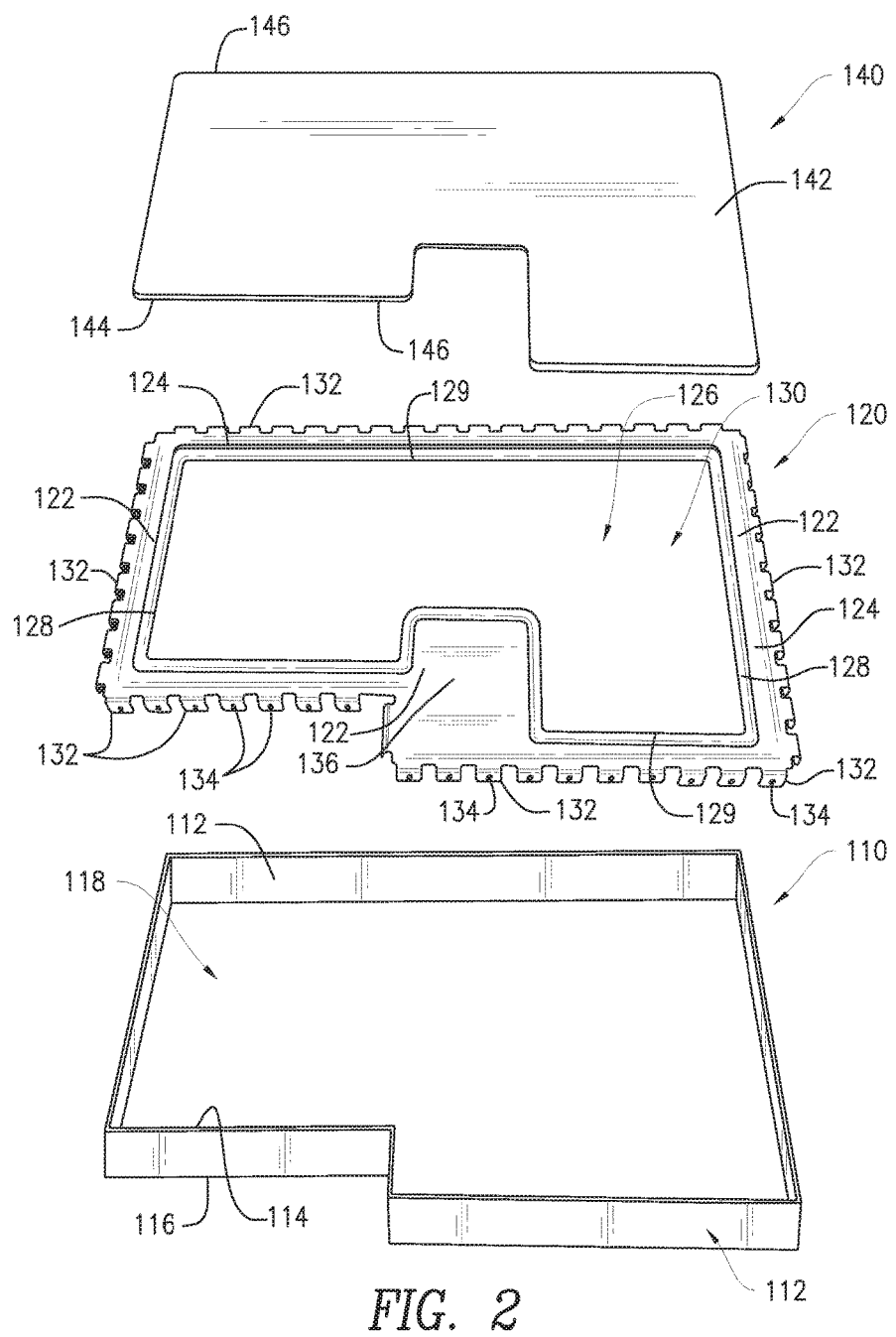
FIG. 2 is an exploded view of the multi-piece shield of FIG. 1.
Figure 3:
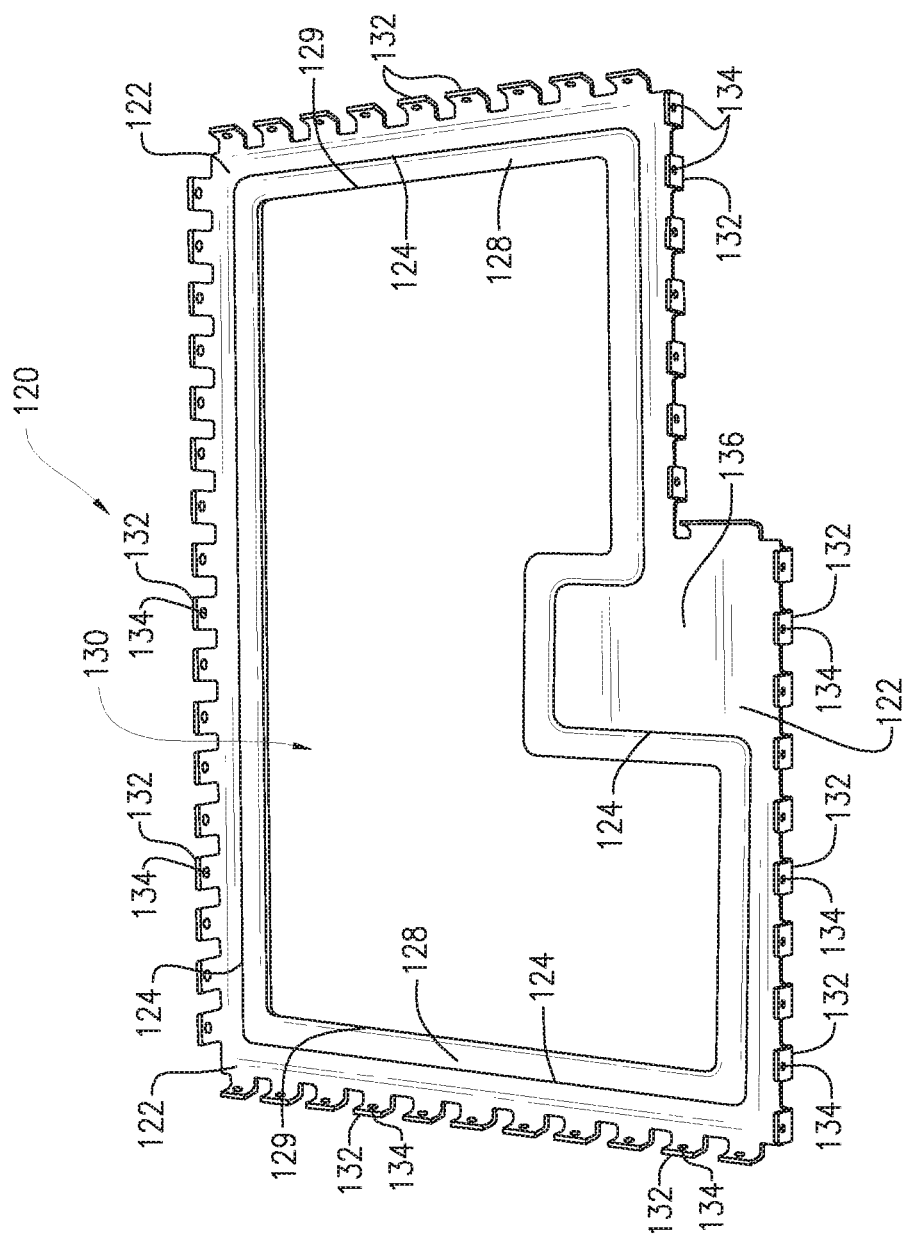
FIG. 3 is a bottom perspective view of the lid of the multi-piece shield of FIG. 1.
Figure 4:
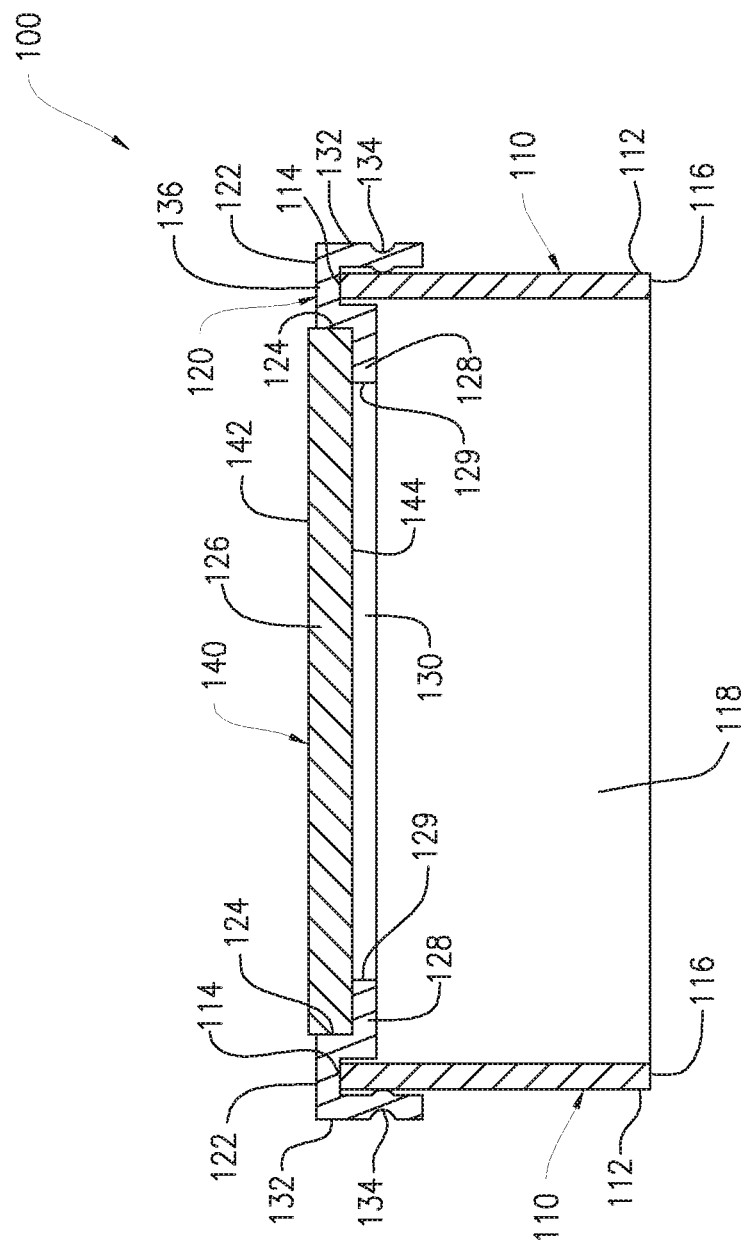
FIG. 4 is a cross-sectional view of the multi-piece shield of FIG. 1 taken along the line 4-4.

FIGS. 1-4 are views of a multi-piece shield 100. More specifically, FIG. 1 is a perspective view of an assembled multi-piece shield having a lid 120, an insert 140, and a fence 110, FIG. 2 is an exploded view of the multi-piece shield 100 of FIG. 1, FIG. 3 is a bottom perspective view of the lid of the multi-piece shield of FIG. 1, and FIG. 4 is a cross-sectional view of the multi-piece shield of FIG. 1 taken along the line 4-4.

The fence 110 is configured to be attached to a circuit board about at least a portion of a circuit (e.g., circuit elements, electrical components, etc.). The fence 110 has sidewalls 112 having a top surface 114 and a bottom surface 116. The height and/or thickness of the sidewalls 112 of the fence 110 may be any size depending on the performance requirements and/or heat dissipation requirements of the electrical components to be shielded. The sidewalls 112 of fence 110 could form an enclosure defining an interior 118 to surround the electrical components. The shape of the fence 110 depends on the shape of the electrical components to be shielded and their location on the circuit board. Accordingly, the fence 110 could be of any size and shape depending on the size, shape, and/or positioning of the electrical elements requiring shielding and/or heat dissipation. The fence 110 could be formed by stamping, milling, and/or bending.

The lid 120 has a top wall 122, an interior wall 124 at least partially defining a recess 126, a shelf 128 having an inner edge 129 and defining an aperture 130, and depending fingers 132 with dimples 134. The exterior perimeter of the top wall 122 of lid 120 corresponds in size and shape to the exterior perimeter of the top wall of fence 110. The size and shape of the interior perimeter of the top wall 122 of lid 120 could be independent of and could be different from the size and shape of the exterior perimeter of the top wall 122 of lid 120 and/or fence 110. The interior perimeter of the top wall 122 could vary in size and/or shape from the exterior perimeter of the top wall 122 depending on performance requirements, the circuit layout, and/or manufacturing purposes. For example, an area of a circuit may be enclosed by the fence 110, but not require heat dissipation and/or shielding (e.g., by the insert). Asymmetry between the interior perimeter and exterior perimeter of the top wall 122 could provide an engagement surface 136, the engagement surface 136 providing an enlarged top wall surface for a robot to engage the lid 120 for automated assembly at the multi-piece shield 100 (e.g., to move, position, and/or assemble the lid 120 while minimizing the risk of accidental deformation of the lid 120).

The interior wall 124 extends downwardly from the interior perimeter of the top wall 122 (e.g., extending perpendicularly from the top wall 122). The shelf 128 extends inwardly (e.g., towards a center of the lid 120) from a bottom of the interior wall 124 (e.g., extending perpendicularly from the interior wall 124). The shelf 128 could be parallel to, and offset from, the top wall 122, and the top wall 122 and shelf 128 could be perpendicular to the interior wall 124. Accordingly, the top surface of the shelf 128 and an inner surface of the interior wall 124 form a recess 126. The inner edge 129 of the shelf 128 forms an aperture 130 therethrough. The recess 126 then being above the aperture 130 (and/or top surface of the shelf 128) but below the top surface of the top wall 122.

The plurality of depending fingers 132 extend downwardly from an exterior perimeter of the top wall 122. Each of the depending fingers 132 could be generally rectangular in shape (or of any other shape). The number of depending fingers 132, the spacing between each of the depending fingers 132, and/or the dimensions (e.g., width, length, etc. of the depending fingers 132) could vary depending on the manufacturing preferences and/or performance requirements. As shown in FIGS. 2-3, each of the depending fingers 132 could have a dimple 134 (or a plurality of dimples 134) defined therein to attach and secure the lid 120 to the fence 110. The dimples 134 are a convex shape on an interior surface (e.g., to frictionally engage the fence 110) and are concave on an exterior surface. Accordingly, the convex portion of the dimples 134 extends inwardly toward a center of the lid 120. Each edge of the lid 120 has a plurality of depending fingers 132. However, instead of having a plurality of depending fingers 132 at each edge, the lid 120 could have one long depending finger 132 for each edge of the top wall 122 where each long depending finger 132 could have one or more dimples 134.

The lid 120 could be manufactured from a single sheet of metal that is stamped (e.g., punched), pressed, and/or bent. For example, the lid 120 could be stamped, forming the aperture 130 and depending fingers 132, and pressed to form the shelf 128, and the depending fingers 132 could be bent to form their final shape.

The insert 140 has a top surface 142, a bottom surface 144 opposite the top surface 142, and a perimeter 146. The perimeter 146 of insert 140 corresponds in size and shape to the interior wall 124 of the lid 120. The insert 140 could be made of any of a variety of materials depending on manufacturing and/or performance requirements. For example, the insert 140 could be made out of aluminum (e.g., for a normal circuit) or a material having a greater heat absorption characteristic (e.g., copper). The insert 140 can be of any variety of shapes depending on manufacturing and/or performance requirements and/or the portion of the circuit board (e.g., the particular electronic components) requiring shielding and/or heat absorption. The insert 140 could be made of a different and/or thicker material than the lid 120. The insert 140 could be formed by stamping.

As shown in FIG. 4, the lid 120 is assembled onto the fence 110 such that the exterior perimeter of the lid 120 aligns with the exterior perimeter of the fence 110, which are substantially similar in size. As a result, as the lid 120 is assembled onto the fence 110, the dimples 134 of the depending fingers 132 force the depending fingers 132 to bend outward slightly. This biases the depending fingers 132 inwardly so that the fingers 132 or the dimples 134 thereon frictionally engage an exterior surface of the fence 110, thereby securing the lid 120 to the fence 110. Alternatively, there could be recesses in the fence 110 such that the dimples 134 engage the recesses of the fence 110 to secure the lid 120 to the fence 110.

The insert 140 is positioned in the recess 126 of the lid 120, such that the bottom surface 144 of the insert 140 contacts the top surface of the shelf 128 of the lid 120 and/or the perimeter 146 of the insert 140 contacts the interior wall 124 of the lid 120. As such, the insert 140 could be press fit and/or interference fit into the lid 120, and/or the bottom surface 144 of the insert 140 could rest on the shelf 128 of the lid 120. When the insert 140 is assembled into the lid 120, the insert 140 could be flush or offset from (e.g., above) the top wall 122 of the lid 120. When the assembled multi-piece shield 100 is positioned over a circuit of a circuit board, the insert 140 (and lid 120) is positioned over and/or proximate to the electrical components providing electromagnetic shielding and facilitating heat dissipation of electrical components of the circuit. The insert 140 can be recessed from the lid 120 to be positioned closer to the circuitry being shielded. When assembled and positioned over the circuit, the insert 140 is directly exposed to the circuit (and circuit elements) through the aperture 130 of the shelf 128 of the lid 120, which provides improved shielding and/or heat dissipation with decreased weight (e.g., due to the aperture 130 of the lid 120).

The resulting assembly is a multi-piece shield 100 having a fence 110 mounted to the circuit board with a lid 120 attached to the top of the fence 110 and an insert 140 positioned in the recess 126 of the interior wall 124 of the lid 120.

Figure 5:
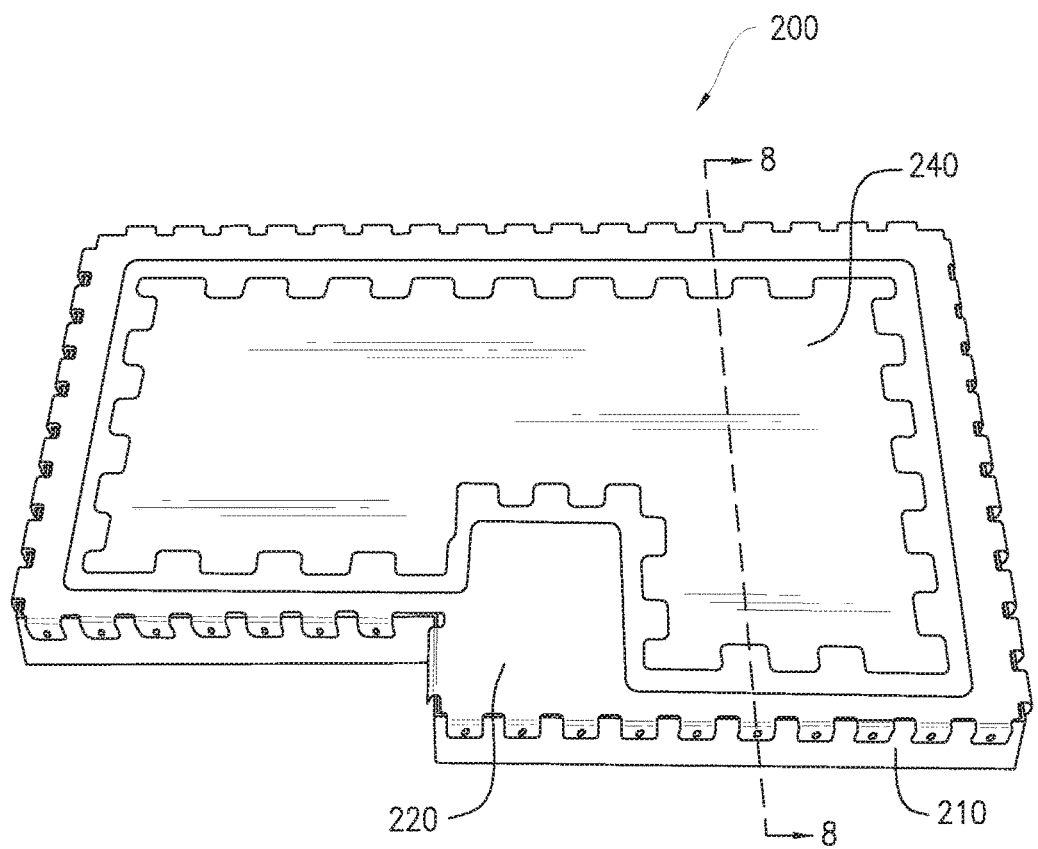
FIG. 5 is a perspective view of a second embodiment of an assembled multi-piece shield.
Figure 6:
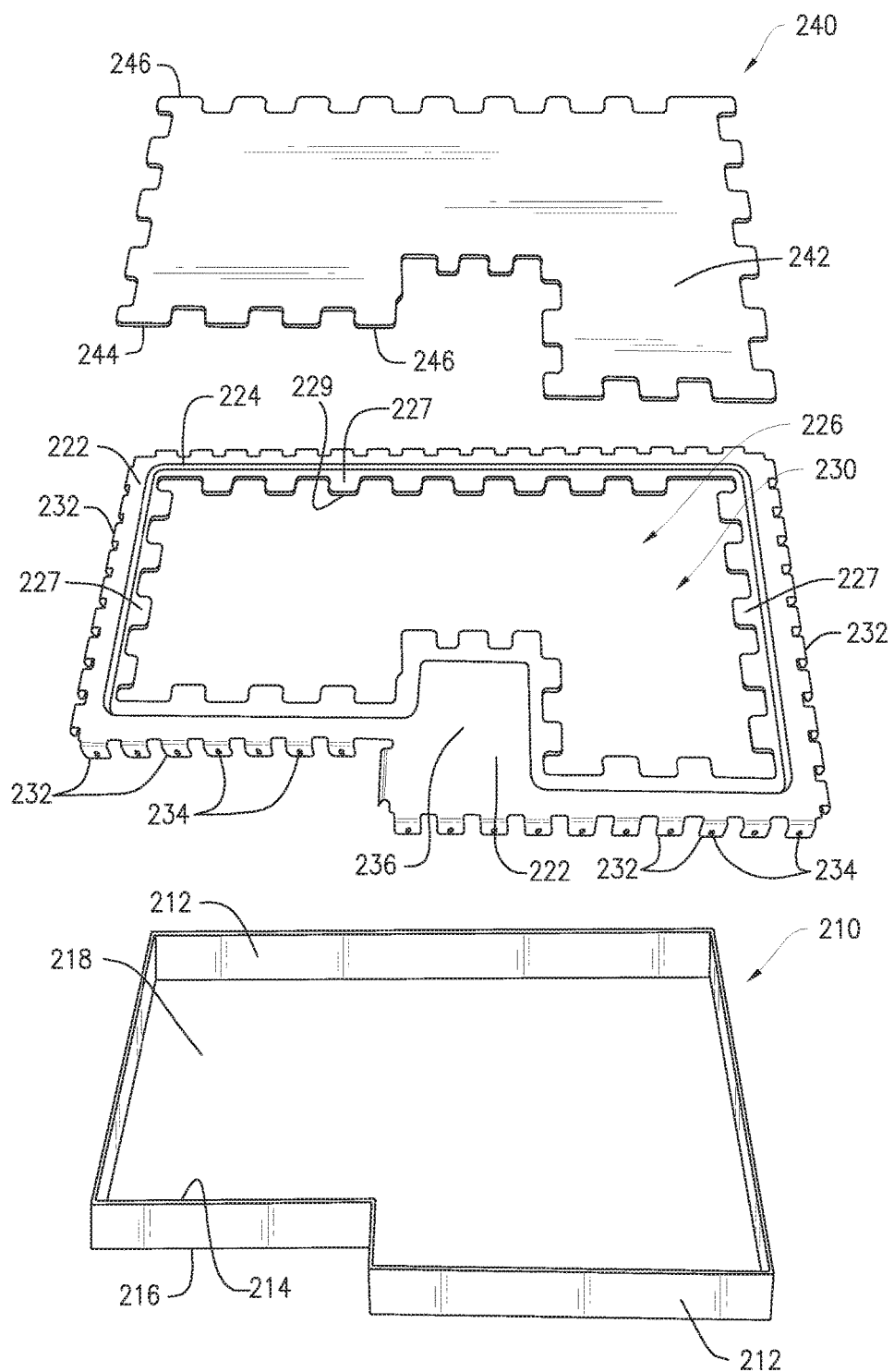
FIG. 6 is an exploded view of the multi-piece shield of FIG. 5.
Figure 7:
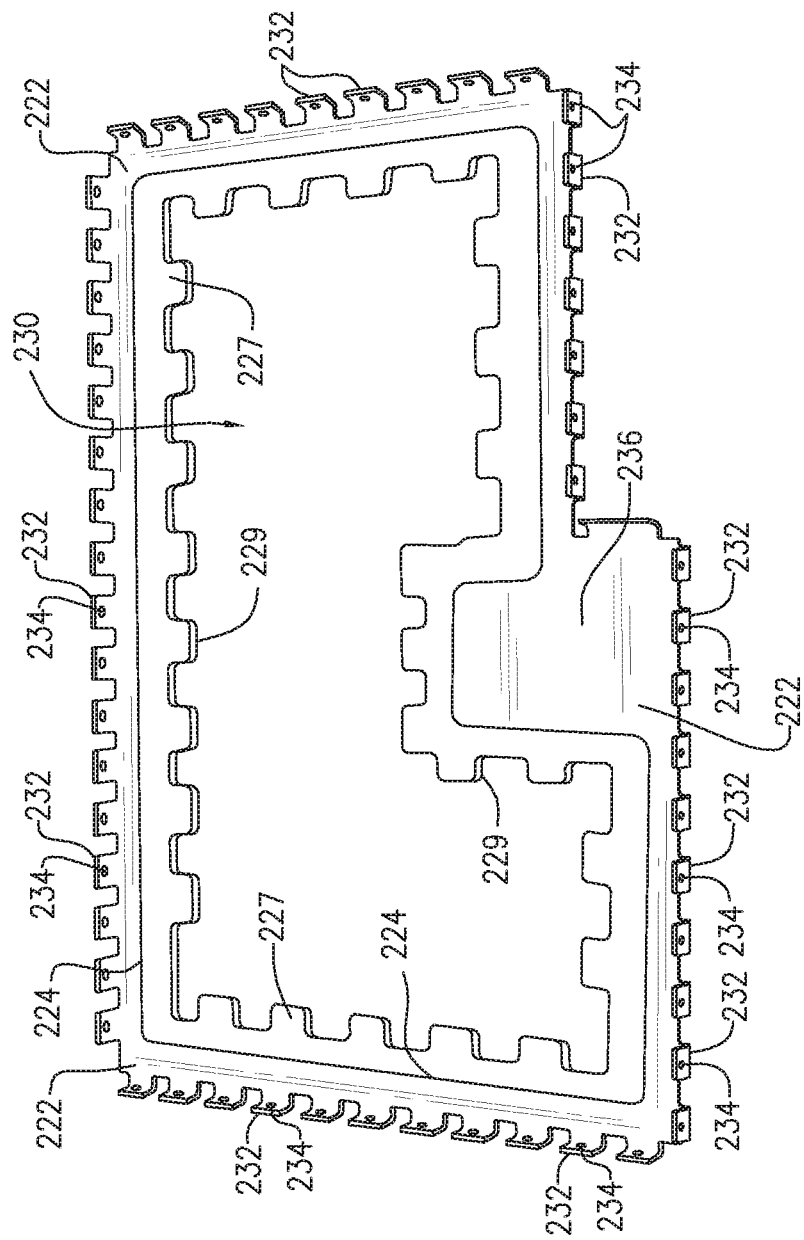
FIG. 7 is a bottom perspective view of the lid of the multi-piece shield of FIG. 5.
Figure 8:
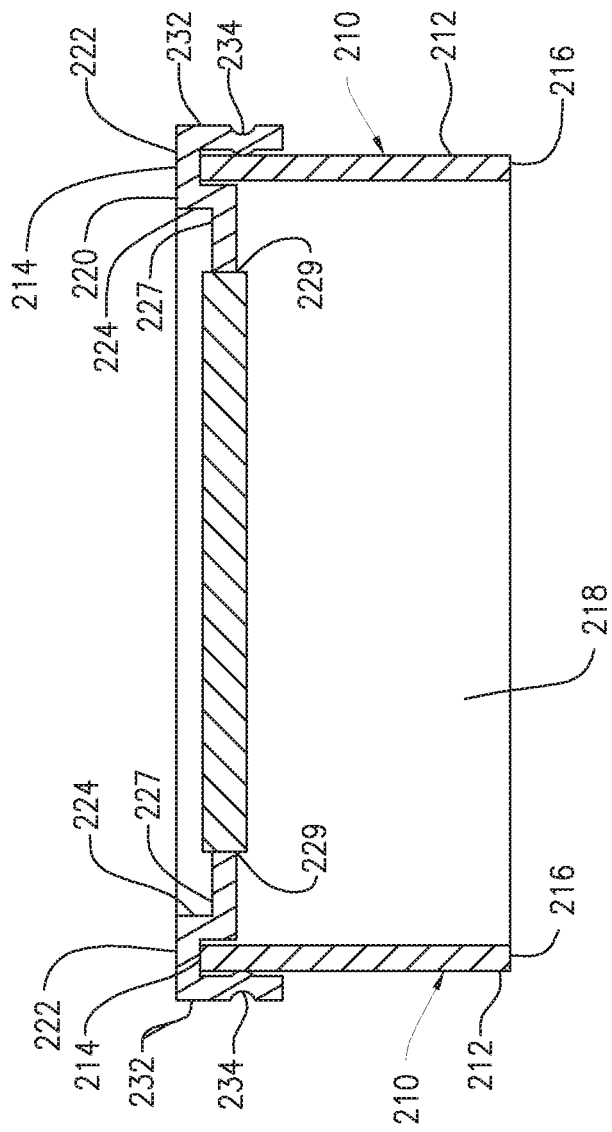
FIG. 8 is a cross-sectional view of the multi-piece shield of FIG. 5 taken along the line 8-8.

FIGS. 5-8 are views of a multi-piece shield 200. FIG. 5 is a perspective view of a second embodiment of an assembled multi-piece shield, FIG. 6 is an exploded view of the multi-piece shield of FIG. 5, FIG. 7 is a bottom perspective view of the lid of the multi-piece shield of FIG. 5, and FIG. 8 is a cross-sectional view of the multi-piece shield of FIG. 5 taken along the line 8-8. The multi-piece shield 200 serves the same function in a similar way as the multi-piece shield 100 described in FIGS. 1-4.

The fence 210 has the same function and shape as fence 110 in FIGS. 1-4. As described above, the fence 210 includes sidewalls 212 having a top surface 214 and a bottom surface 216. The sidewalls 212 of fence 210 could form an enclosure defining an interior 218 to surround the electrical components.

Similar to the lid 120 described above with respect to FIGS. 1-4, the lid 220 has a top wall 222, an interior wall 224 at least partially defining a recess 226, retaining tabs 227 having an inner edge 229 and defining an aperture 230, and depending fingers 232 with dimples 234. As described above, the exterior perimeter of the top wall 222 of lid 220 corresponds in size and shape to the exterior perimeter of the top wall of fence 210, and the interior perimeter of the top wall 222 could vary in size and/or shape from the exterior perimeter of the top wall 222 depending on performance requirements, the circuit layout, and/or manufacturing purposes. Asymmetry between the interior perimeter and exterior perimeter of the top wall 222 could provide an engagement surface 236, as described above. The interior wall 224 extends downwardly from the interior perimeter of the top wall 222. The interior wall 224 could be of any length or depth to facilitate an insert 240 of various thicknesses. For this embodiment, the interior wall 224 is not necessary, but the interior wall 224 allows the insert to be flush with the top wall 222 of lid 220. The lid 220 could be manufactured from a single sheet of metal that is stamped (e.g., punched), pressed, and/or bent.

The plurality of depending fingers 232 extend downwardly from an exterior perimeter of the top wall 122. Each of the depending fingers 232 could have a dimple 234 (or a plurality of dimples 234) defined therein to attach and secure the lid 220 to the fence 210. As stated above, instead of having a plurality of depending fingers 232 at each edge, the lid 220 could have one long depending finger 232 for each edge of the top wall 222 where each long depending finger 232 could have a plurality of dimples 234.

Similar to the shelf 128 of the lid 120 described in FIGS. 1-4, the retaining tabs 227 engage the insert 240. The retaining tabs 227 extend inwardly (e.g., towards a center of the lid 220) from a bottom of the interior wall 224 (e.g., extending perpendicularly from the interior wall 224). The retaining tabs 227 could be parallel to, and offset from, the top wall 222, and the top wall 222 and retaining tabs 227 could be perpendicular to the interior wall 224. Each of the retaining tabs 227 could be generally rectangular in shape (or of any other shape). The number of retaining tabs 227, the spacing between each of the retaining tabs 227, and/or the dimensions (e.g., width, length, etc. of the retaining tabs 227) could vary depending on the manufacturing preferences and/or performance requirements. The top surface of the retaining tabs 227 (e.g., lower than the top wall 222) and an inner surface of the interior wall 224 form a recess 226. The inner edge 229 of the retaining tabs 227 forms an aperture 230 therethrough. The recess 226 then being above the aperture 230 (and/or top surface of the retaining tabs 227) but below the top surface of the top wall 222. In this way the retaining tabs 227 increase the surface area of the inner edge 229 for better engagement with the exterior edge of the perimeter wall 246 of the insert 240.

As described above in FIGS. 1-4, the insert 240 has a top surface 242, a bottom surface 244 opposite the top surface 242, and a perimeter wall 246. The perimeter wall 246 of insert 240 corresponds in size and shape to the interior edge 229 of the retaining tabs 227.

As shown in FIG. 8, the lid 220 is assembled onto the fence 210, as described above in FIGS. 1-4.

The insert 240 is positioned in the aperture 230 (and could also be positioned in at least a portion of the recess 226), such that the perimeter wall 246 (e.g., exterior edge) of the insert 240 contacts the inner edge 229 of the retaining tabs 227 of the lid 220. As such, the insert 240 could be press fit and/or interference fit into the lid 220. The retaining tabs 227 formation increases the contact surface between the lid 220 and the insert 240 to better secure the insert 240 to the lid 220. When the assembled multi-piece shield 200 is positioned over a circuit of a circuit board, the insert 240 (and lid 220) is positioned over and/or proximate to the electrical components providing electromagnetic shielding and facilitating heat dissipation of electrical components of the circuit. When assembled and positioned over the circuit, the insert 240 is directly exposed to the circuit (and circuit elements) through the aperture 230 of the retaining tabs 227 of the lid 120, which provides improved shielding and/or heat dissipation with decreased weight (e.g., due to the aperture 230 of the lid 220).

The resulting assembly is a multi-piece shield 200 having a fence 210 mounted to the circuit board with a lid 220 attached to the top of the fence 210 and an insert 240 positioned in the aperture 230 of the interior wall 224 of the lid 220.

The multi-piece shield 200 described in FIGS. 5-8 could have a thinner profile than the multi-piece shield 100 described in FIGS. 1-4 because the insert 240 of the multi-piece shield 200 is positioned within the aperture 230 formed by the retaining tabs 227, rather than positioning the insert 140 on top of the shelf 128 as in the multi-piece shield 100. Thus, the multi-piece shield 200 could be thinner than the multi-piece shield 100 by at least the thickness of the lid 120 (e.g., the shelf 128). Also, in FIGS. 5-8, more surface area of the insert 240 could be exposed to the circuit as the retaining tabs 227 do not overlap any of the insert 240 (e.g., as in multi-piece shield 100 where the shelf 128 overlaps with the insert 140).

The present disclosure may be embodied in other specific forms without departing from the spirit or essential attributes of the disclosure.

Having thus described the disclosure in detail, it is to be understood that the foregoing description is not intended to limit the spirit or scope thereof. It will be understood that the embodiments of the present disclosure described herein are merely exemplary and that a person skilled in the art may make any variations and modification without departing from the spirit and scope of the disclosure. All such variations and modifications, including those discussed above, are intended to be included within the scope of the disclosure.

What is claimed is:

1. A multi-piece electromagnetic radiation and heat dissipation shield for electrical components, comprising:
   a fence having sidewalls forming an enclosure surrounding electrical components;
   a lid having a top wall, an interior wall depending from the top wall and defining a recess, a shelf extending from the interior wall and offset from the top wall, the shelf having an inner edge defining an aperture, and a plurality of depending fingers about an outer periphery of the lid, the plurality of depending fingers engaging the sidewalls of the fence; and
   an insert having a perimeter sized and shaped to be received within the recess defined by the interior wall and on the shelf, wherein the insert shields the electrical components from electromagnetic radiation and dissipates heat from the electrical components.

2. The multi-piece shield of claim 1, wherein the shelf extends parallel to the top wall of the lid.

3. The multi-piece shield of claim 1, wherein a bottom surface of the insert contacts a top surface of the shelf of the lid.

4. The multi-piece shield of claim 1, wherein the insert is press-fit into the lid.

5. The multi-piece shield of claim 4, wherein the insert has an outer edge that frictionally engages the interior wall of the lid.

6. The multi-piece shield of claim 1, wherein the insert is directly exposed to the electrical components through the aperture of the lid.

7. The multi-piece shield of claim 1, wherein a top surface of the insert is coplanar with the top wall of the lid.

8. The multi-piece shield of claim 1, wherein a top surface of the insert extends above the top wall of the lid.

9. The multi-piece shield of claim 1, wherein each of the plurality of depending fingers includes a dimple on interior surfaces of the plurality of depending fingers to frictionally engage the fence.

10. The multi-piece shield of claim 9, wherein in an assembled configuration, the dimples are configured to force the plurality of depending fingers outward, thereby biasing the plurality of depending fingers against the fence.

11. The multi-piece shield of claim 10, wherein the dimples engage recesses on the fence, thereby securing the lid to the fence.

12. The multi-piece shield of claim 1, wherein the lid is made of a first material and the insert is made of a second material.

13. The multi-piece shield of claim 1, wherein the insert is formed from aluminum.

14. The multi-piece shield of claim 1, wherein the insert is formed from copper.

\* \* \* \* \*